United States Patent
Lee

(10) Patent No.: US 6,617,202 B2
(45) Date of Patent: Sep. 9, 2003

(54) METHOD FOR FABRICATING A FULL DEPLETION TYPE SOI DEVICE

(75) Inventor: Jong Wook Lee, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 09/891,530

(22) Filed: Jun. 27, 2001

(65) Prior Publication Data

US 2002/0029372 A1 Mar. 7, 2002

(30) Foreign Application Priority Data

Jun. 28, 2000 (KR) .......................................... 2000-36133

(51) Int. Cl.[7] .............................................. H01L 21/00
(52) U.S. Cl. ........................ 438/149; 438/151; 438/197; 438/299; 438/482; 438/585
(58) Field of Search ................................. 438/149, 585, 438/586, 926, 666, 665, 184, 199, 217, 591, 299, 300, 301, 592, 164, 151, 197, 294, 482, 167, 162, 172, 289

(56) References Cited

U.S. PATENT DOCUMENTS

| | | | |
|---|---|---|---|
| 5,438,007 A | * 8/1995 | Vinal et al. | 438/289 |
| 6,225,196 B1 | * 5/2001 | Yokoyama | 438/482 |
| 6,380,013 B2 | * 4/2002 | Lee | 438/184 |
| 6,461,903 B2 | * 10/2002 | Lee | 438/164 |
| 6,465,334 B1 | * 10/2002 | Buynoski et al. | 438/591 |
| 2002/0001930 A1 | * 1/2002 | Lee | 438/585 |

FOREIGN PATENT DOCUMENTS

| | | | |
|---|---|---|---|
| EP | 06216376 A | * 8/1994 | ......... H01L/21/316 |

* cited by examiner

Primary Examiner—Matthew Smith
Assistant Examiner—Igwe U. Anya
(74) Attorney, Agent, or Firm—Finnegan, Henderson, Farabow, Garrett & Dunner, L.L.P.

(57) ABSTRACT

Disclosed is a method for SOI device, and particularly to a method for fabricating a full depletion type SOI device capable of minimizing a change in a threshold voltage of transistor according to a change in a thickness of semiconductor layer. The disclosed method for fabricating a full depletion type SOI device comprises: preparing a SOI wafer having a stack structure consisted of a base substrate, a buried oxide film, and a semiconductor layer, forming a dummy gate on an active region of the semiconductor layer, forming source/drain regions on an active region of the semiconductor layer at both sides of the dummy gate, depositing an insulating layer over the dummy gate and the semiconductor layer, polishing the insulating film using the dummy gate as a polishing stop layer, removing the dummy gate, etching a predetermined thickness of semiconductor layer exposed by removing the dummy gate, growing a delta doped silicon film and a silicon film doped in a low concentration on a remaining part of the semiconductor layer, the total thickness thereof being equal to that of the source/drain regions, and forming a gate having a gate oxide film on the silicon film doped in a low concentration.

3 Claims, 4 Drawing Sheets

METHOD FOR FABRICATING A FULL DEPLETION TYPE SOI DEVICE

BACKGROUND OF THE INVENTION

1. Field of the Invention

This invention relates to a method for fabricating a SOI device, and more particularly, to a method for fabricating a full depletion type SOI device capable of minimizing a change in threshold voltage of transistor according to a change in the thickness of semiconductor layer.

2. Description of the Related Art

With high performance of semiconductor devices, the semiconductor integration technology using SOI wafer having a stack structure of a buried oxide film sandwiched between a base substrate and a semiconductor layer instead of single crystal silicon wafer being comprised of a bulk silicon has been proposed. The semiconductor device integrated in SOI wafer (hereinafter, referred to SOI device) has advantages over the semiconductor integrated in single crystal silicon wafer in that it is capable of achieving the high speed by a low junction capacitance and reduction of latch-up by the complete device isolation.

The SOI device is classified into a full depletion type device and a part depletion type device according to the thickness of the semiconductor layer where the device is to be formed.

In the part depletion type SOI device, an error-operation is generated by a parasitic bipolar transistor and floating body effect such as a kink phenomenon since the body of a transistor is fully isolated by a field oxide film and a buried oxide film. As a result, an operation performance becomes unstable. However, in the full depletion type SOI device, a neutral layer is not present on boundary between a channel region and a source region since the channel region is fully depleted even though a gate voltage is 0V. As a result, the full depletion type SOI device is capable of preventing a floating body effect which is usually generated in the part depletion type SOI device.

Accordingly, more efforts are being made to develop the full depletion type SOI device than the part depletion type SOI device.

Despite the advantages of the full depletion type SOI devices, it is difficult to ensure a reliability because the threshold voltage of the transistor is considerably changed according to the change of the thickness of the semiconductor layer where a device is to be formed.

SUMMARY OF THE INVENTION

Therefore, it is an object of the invention to provide a method for fabricating a full depletion type SOI device capable of minimizing a change in threshold voltage of transistor according to the change in the thickness of a semiconductor layer.

There is provided to a method for fabricating a full depletion type SOI device comprising the steps of: preparing a SOI wafer having a stack structure consisting of a base substrate, a buried oxide film, and a semiconductor layer; forming a dummy gate on an active region of the semiconductor layer; forming source/drain regions on an active region of the semiconductor layer at both sides of the dummy gate; depositing an insulating film over the dummy gate and the semiconductor layer; polishing the insulating film using the dummy gate as a polishing stop layer; removing the dummy gate; etching a predetermined thickness of semiconductor layer exposed by the removal of the dummy gate; growing a delta doped silicon film and a silicon film doped in a low concentration on a remaining part of the semiconductor layer, the total thickness thereof being equal to that of the source/drain regions; and forming a gate having a gate oxide film on the silicon film doped in a low concentration.

The above objects and other features and advantages of the present invention will become more apparent in light of the following detailed description and the accompanying figures.

DETAILED DESCRIPTION OF THE INVENTION

Now, the present invention will be described in detail, with reference to a preferred embodiment illustrated in FIGS. 1A to 1E.

Figure 1A:
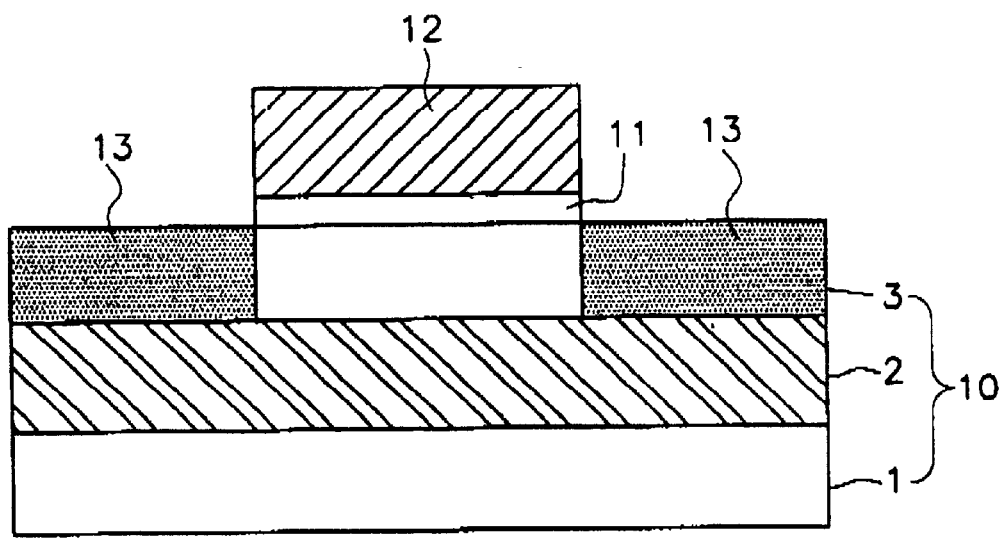
FIGS. 1A, 1B, 1C, 1D, and 1E are sectional views illustrating a method for fabricating a full depletion type SOI device according to a preferred embodiment of the invention.

Referring to FIG. 1A, a SOI wafer 10 having a stack structure consisting of a base substrate 1, a buried oxide film 2, and a semiconductor layer 3 is prepared. A field oxide film (not shown) is formed to the depth to be contacted with the buried oxide film 2 on a predetermined part of the semiconductor layer 3 to define an active region. A dummy gate 12 having a dummy gate oxide film 11 is formed on the active region of the semiconductor layer 13 through the known process. Source and drain regions 13 are formed on the active region of the semiconductor layer 3 at opposite sides of the dummy gate 12.

Figure 1B:
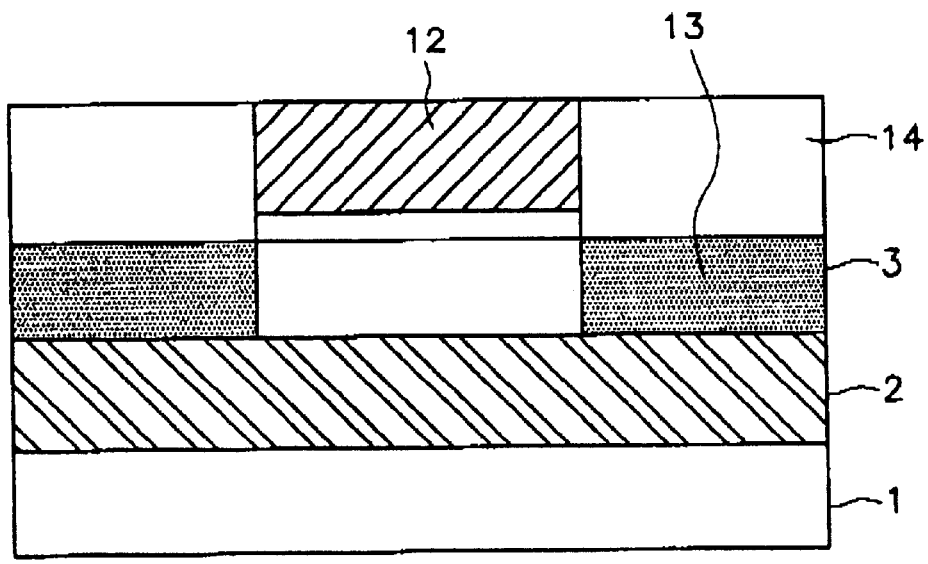

Referring to FIG. 1B, an insulating film 14 is thickly deposited over the dummy gate 12 and over the semiconductor layer 13, and then the insulating film is polished in accordance with a CMP process using the dummy gate 12 as a polishing stop layer.

Figure 1C:
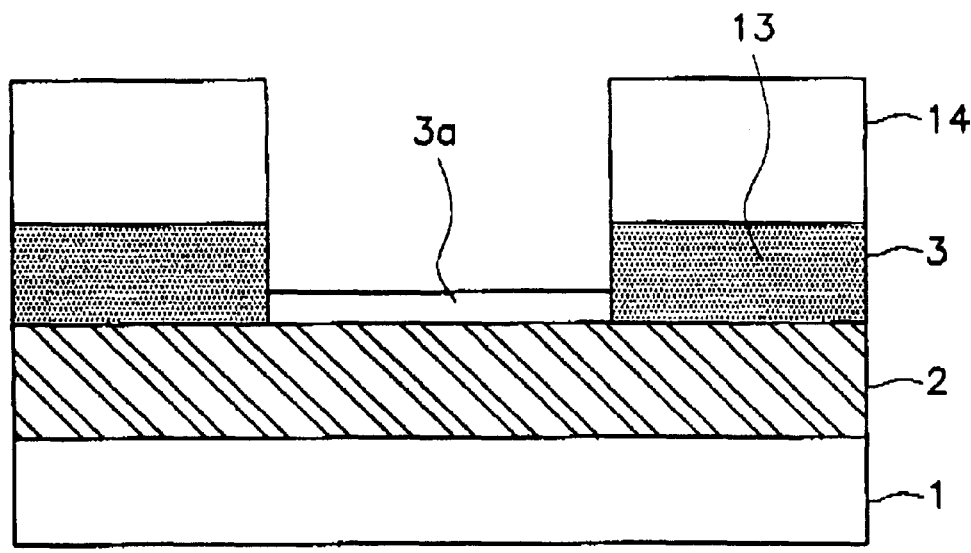

Referring to FIG. 1C, a dummy gate 12 exposed by the CMP process and a dummy gate oxide film 11 under the dummy gate 12 are removed by dry or wet etching process. The semiconductor layer exposed by the removal of the dummy gate 12 and dummy gate oxide film 11 is etched with a predetermined thickness by wet or dry etching process. Here, a reference numeral 3a is the remaining part of semiconductor layer to be etched.

Figure 1D:
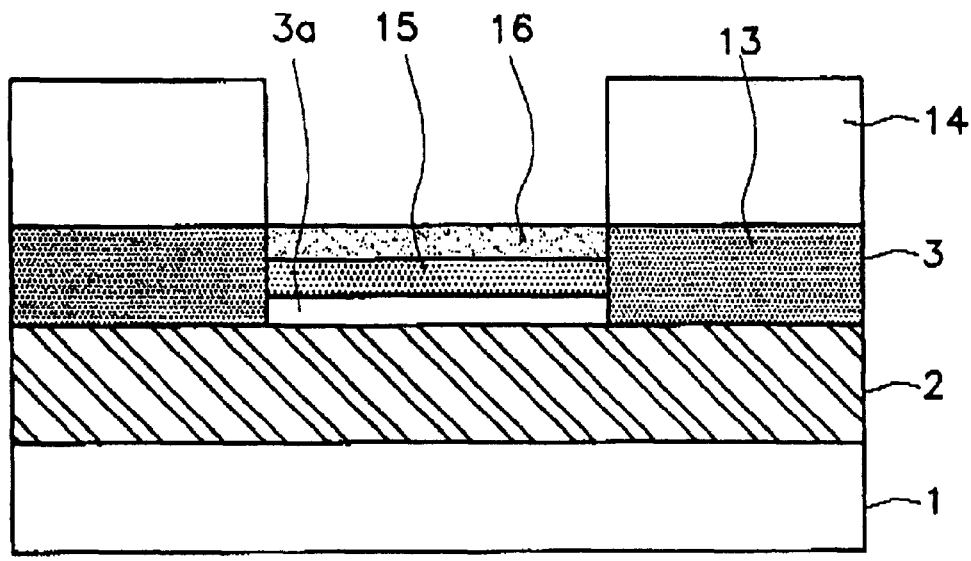

Referring to FIG. 1D, a delta doped first silicon layer 15 and a second silicon layer 16 doped in a low concentration are grown on the remaining part 3a of semiconductor layer through a selective epitaxial growth process. The second silicon layer 16 is doped in a lower concentration than the delta doped first silicon layer. For example, the low concentration doping is doped in $5 \times 10^{17}$ ions/cm$^3$. Here, it is preferable that a total growth thickness of the first and the second silicon films 15 and 16 and the remaining part 3a of the semiconductor layer are equal to the thickness of the source and drain regions 13.

Figure 1E:
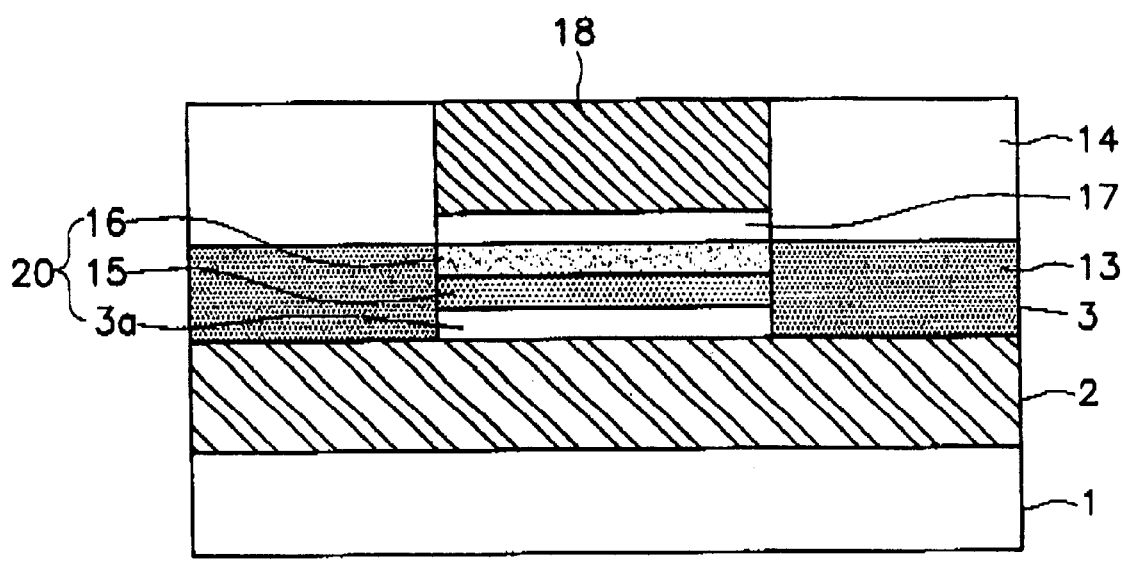

Referring to FIG. 1E, a gate oxide film 17 is formed on the second silicon film 16. A conductive film for gate is deposited thicker than the insulating film 14 over the resultant structure, and then the conductive film is etched back or polished, thereby forming a gate 18. As a result, the full depletion type SOI device in accordance with the present invention is completed.

In accordance with the present invention, the body of a transistor, that is, channel region comprises a semiconductor layer 3a, the first silicon film 15, and the second silicon film, therefore, a change in the threshold voltage of a transistor is restricted because the depletion charge in a channel region is uniformly maintained by the delta doped first silicon film 15.

Figure 2:
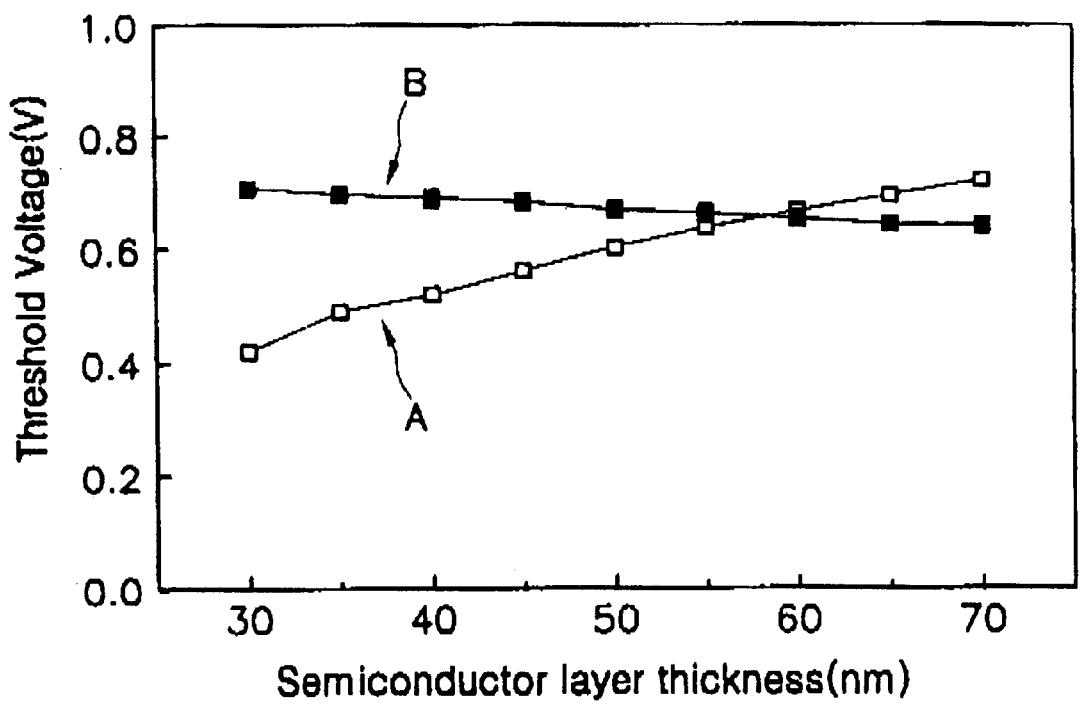
FIG. 2 is a graph illustrating simulation results of a change of threshold voltage according to the change in thickness of semiconductor layer in a prior art and present invention.

FIG. 2 is a graph illustrating the simulation results on a change in the threshold voltage according to the thickness of semiconductor layer in a prior art and present invention.

As shown in FIG. 2, the full depletion type SOI device B in accordance with the present invention is relatively small in change of the threshold voltage of a transistor according to the thickness of semiconductor layer relative to that of the full depletion type SOI device in a prior art A. It is because a depletion charge quantity in the channel region is decided by the delta doped first silicon film formed on the channel region.

In accordance with the present invention, the full depletion type SOI device is capable of maintaining depletion charges in the channel region uniformly by the delta doped silicon film though the thickness of semiconductor film changes, thereby maintaining uniformly the threshold voltage. Moreover, the full depletion type SOI device in accordance with the present invention can control the threshold voltage by controlling the growth position, concentration, and thickness of the delta doped silicon film.

In accordance with the present invention, the gate oxide film is a low temperature oxide film formed using a method selected from LP-CVD, AP-CVD, ECR-CVD, MO-CVD, Photo-CVD, and Plasma-CVD to maintain a doping distribution in the delta doped silicon film. The low temperature oxide film is formed at less than 600° C. Here, $Al_2O_3$ or $Ta_2O_5$ is used as the low temperature oxide film.

As described above, in accordance with the present invention, depletion charges on the channel region are uniformly maintained by inserting the delta doped silicon film on a part of semiconductor layer where a channel region is to be formed by the selective epitaxial growth process. Accordingly, in accordance with the present invention, the change in the threshold voltage according to the change in the thickness of semiconductor layer is reduced, thereby improving the device characteristics and reliability.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating a full depletion type SOI device comprising the steps of:

providing a SOI wafer having a stack structure consisting of a base substrate, a buried oxide film, and a semiconductor layer;

forming a dummy gate on an active region of the semiconductor layer, the dummy gate having a first side and a second side;

forming a source region and a drain region on the active region of the semiconductor layer at the first side and the second side of the dummy gate, respectively;

forming an insulating film over the dummy gate and the semiconductor layer;

polishing the insulating film using the dummy gate as a polishing stop layer;

removing the dummy gate;

etching a predetermined thickness of semiconductor layer exposed by the removal of the dummy gate;

growing a delta doped silicon film and a silicon film doped in a low concentration on a remaining part of the semiconductor layer, having a total thickness thereof equal to both a thickness of the source region and a thickness of the drain region; and forming a gate having a gate oxide film on the silicon film doped in a low concentration.

2. The method according to claim 1, wherein the gate oxide film is formed as a low temperature oxide film.

3. The method according to claim 2, wherein the low temperature oxide film is $Al_2O_3$ film or $Ta_2O_5$ film.

* * * * *

UNITED STATES PATENT AND TRADEMARK OFFICE
CERTIFICATE OF CORRECTION

PATENT NO. : 6,617,202 B2 Page 1 of 1
DATED : September 9, 2003
INVENTOR(S) : Jong Wook Lee It is certified that error appears in the above-identified patent and that said Letters Patent is hereby corrected as shown below:

<u>Title page,</u>
Item [*] Notice, should read:
-- [*]  Notice:   Subject to any disclaimer, the term of this patent is extended or adjusted under 35 U.S.C. 154(b) by 185 days. --

Signed and Sealed this

Twenty-seventh Day of January, 2004

JON W. DUDAS
*Acting Director of the United States Patent and Trademark Office*